United States Patent
Igarashi et al.

(10) Patent No.: US 9,164,374 B2
(45) Date of Patent: Oct. 20, 2015

(54) PHOTOMASK MAKING METHOD, PHOTOMASK BLANK AND DRY ETCHING METHOD

(71) Applicant: SHIN-ETSU CHEMICAL CO., LTD., Chiyoda-ku, Tokyo (JP)

(72) Inventors: Shinichi Igarashi, Joetsu (JP); Hideo Kaneko, Joetsu (JP); Yukio Inazuki, Joetsu (JP); Kazuhiro Nishikawa, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 13/647,944

(22) Filed: Oct. 9, 2012

(65) Prior Publication Data

US 2013/0034806 A1 Feb. 7, 2013

Related U.S. Application Data

(62) Division of application No. 12/687,539, filed on Jan. 14, 2010, now Pat. No. 8,304,146.

(30) Foreign Application Priority Data

Jan. 15, 2009 (JP) ................................. 2009-006907
Jan. 15, 2009 (JP) ................................. 2009-006929

(51) Int. Cl.
*B44C 1/22* (2006.01)
*C03C 15/00* (2006.01)
(Continued)

(52) U.S. Cl.
CPC .. *G03F 1/80* (2013.01); *G03F 1/14* (2013.01); *G03F 1/32* (2013.01); *G03F 1/26* (2013.01)

(58) Field of Classification Search
CPC ............... G03F 1/14; G03F 1/26; G03F 1/32; G03F 1/80; G03F 1/46; G03F 1/08; G03F 1/34; G03F 1/24; G03F 1/54; C23F 4/00; H01L 21/32136; H01L 21/32137
USPC .................... 216/67, 75, 68, 76, 79; 428/428; 438/721; 430/5
See application file for complete search history.

(56) References Cited

U.S. PATENT DOCUMENTS 4,832,787 A * 5/1989 Bondur et al. .................. 216/18
5,830,607 A 11/1998 Isao et al.
(Continued)

FOREIGN PATENT DOCUMENTS

EP 1 650 600 A2 4/2006
EP 1 832 926 A2 9/2007
(Continued)

OTHER PUBLICATIONS

European Search Report dated Jul. 19, 2012 for European Application No. 10 00 0280.

*Primary Examiner* — Nadine Norton
*Assistant Examiner* — Christopher Remavege
(74) *Attorney, Agent, or Firm* — Birch Stewart Kolasch & Birch, LLP

(57) ABSTRACT

A photomask is manufactured by providing a photomask blank comprising a transparent substrate, a phase shift film, and a light-shielding film, the phase shift film and the light-shielding film including silicon base material layers, a N+O content in the silicon base material layer of the phase shift film differing from that of the light-shielding film, and chlorine dry etching the blank with oxygen-containing chlorine gas in a selected O/Cl ratio for selectively etching away the silicon base material layer of the light-shielding film.

21 Claims, 4 Drawing Sheets

(51) Int. Cl.
*G03F 1/80* (2012.01)
*G03F 1/00* (2012.01)
*G03F 1/32* (2012.01)
*G03F 1/26* (2012.01)

(56) References Cited

U.S. PATENT DOCUMENTS

| | | | |
|---|---|---|---|
| 7,115,341 B2 * | 10/2006 | Shiota et al. | 430/5 |
| 7,622,227 B2 | 11/2009 | Inazuki et al. | |
| 7,935,461 B2 * | 5/2011 | Nozawa et al. | 430/5 |
| 8,029,948 B2 * | 10/2011 | Hashimoto et al. | 430/5 |
| 8,043,771 B2 * | 10/2011 | Kominato et al. | 430/5 |
| 8,309,277 B2 * | 11/2012 | Igarashi et al. | 430/5 |
| 8,507,155 B2 * | 8/2013 | Iwashita et al. | 430/4 |
| 2006/0088774 A1 * | 4/2006 | Yoshikawa et al. | 430/5 |
| 2006/0166106 A1 * | 7/2006 | Chandrachood et al. | 430/5 |
| 2007/0212618 A1 | 9/2007 | Yoshikawa et al. | |
| 2007/0212619 A1 | 9/2007 | Yoshikawa et al. | |
| 2010/0081066 A1 * | 4/2010 | Nozawa | 430/5 |

FOREIGN PATENT DOCUMENTS

| | | |
|---|---|---|
| EP | 1 847 874 A2 | 10/2007 |
| JP | 63-85553 A | 4/1988 |
| JP | 7-140635 A | 6/1995 |
| JP | 2001-27799 A | 1/2001 |
| JP | 2004-333653 A | 11/2004 |
| JP | 2006-317665 A | 11/2006 |
| JP | 2007-241060 A | 9/2007 |
| JP | 2007-241065 A | 9/2007 |

* cited by examiner

PHOTOMASK MAKING METHOD, PHOTOMASK BLANK AND DRY ETCHING METHOD

CROSS-REFERENCE TO RELATED APPLICATION

This application is a Divisional of co-pending application Ser. No. 12/687,539, filed on Jan. 14, 2010. Priority is also claimed to Japanese Application No. 2009-006907 filed on Jan. 15, 2009. The entire contents of each of these applications is hereby incorporated by reference.

TECHNICAL FIELD

This invention relates to a method for manufacturing photomasks for use in the microfabrication of semiconductor integrated circuits, charge coupled devices (CCD), liquid crystal display (LCD) color filters, magnetic heads or the like, photomask blanks from which photomasks are manufactured, and a dry etching method suitable in processing photomask blanks into photomasks.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing interlayer connections. As a consequence, in the manufacture of circuit pattern-written photomasks for use in the photolithography of forming such wiring patterns and contact hole patterns, a technique capable of accurately writing finer circuit patterns is needed to meet the miniaturization demand.

In order to form a higher accuracy photomask pattern on a photomask substrate, it is of first priority to form a high accuracy resist pattern on a photomask blank. Since the photolithography carries out reduction projection in actually processing semiconductor substrates, the photomask pattern has a size of about 4 times the actually necessary pattern size, but an accuracy which is not loosened accordingly. The photomask serving as an original is rather required to have an accuracy which is higher than the pattern accuracy following exposure.

Further, in the currently prevailing lithography, a circuit pattern to be written has a size far smaller than the wavelength of light used. If a photomask pattern which is a mere 4-time magnification of the circuit feature is used, a shape corresponding to the photomask pattern is not transferred to the resist film due to influences such as optical interference occurring in the actual photolithography operation. To mitigate these influences, in some cases, the photomask pattern must be designed to a shape which is more complex than the actual circuit pattern, i.e., a shape to which the so-called optical proximity correction (OPC) is applied. Then, at the present, the lithography technology for obtaining photomask patterns also requires a higher accuracy processing method. The lithographic performance is sometimes represented by a maximum resolution. As to the resolution limit, the lithography involved in the photomask processing step is required to have a maximum resolution accuracy which is equal to or greater than the resolution limit necessary for the photolithography used in a semiconductor processing step using a photomask.

A photomask pattern is generally formed by forming a photoresist film on a photomask blank having a light-shielding film on a transparent substrate, writing a pattern using electron beam, and developing to form a resist pattern. Using the resulting resist pattern as an etch mask, the light-shielding film is etched into a light-shield pattern. In an attempt to miniaturize the light-shield pattern, if processing is carried out while maintaining the thickness of the resist film at the same level as in the art prior to the miniaturization, the ratio of film thickness to pattern width, known as aspect ratio, becomes higher. As a result, the resist pattern profile is degraded, preventing effective pattern transfer, and in some cases, there occurs resist pattern collapse or stripping. Therefore, the miniaturization must entail a thickness reduction of resist film.

As to the light-shielding film material, chromium base materials were used in the prior art. It is described in JP-A 2007-241065 that silicon base materials such as materials containing silicon or materials containing silicon and a transition metal have good light-shielding properties to exposure light with a wavelength up to 200 nm, are susceptible to fluorine dry etching which will cause minimal damage to the resist pattern, and can thus be processed at a higher accuracy. When these materials are combined with the etching technique using an etching mask to enable higher accuracy processing, the procedure of processing a light-shielding film of silicon base material using a chromium base material as an etching mask is reduced in pattern dependency and processing error due to side etching, as compared with the procedure of processing a film of chromium base material using a silicon base material as an etching mask (see JP-A 2007-241060). Thus, films formed of silicon base materials are considered promising as the light-shielding film of the next generation.

CITATION LIST

Patent Document 1: JP-A 2007-241065
Patent Document 2: JP-A 2007-241060
Patent Document 3: JP-A 2001-027799
Patent Document 4: JP-A 2004-333653
Patent Document 5: JP-A S63-85553
Patent Document 6: JP-A H07-140635
Patent Document 7: JP-A 2006-317665

SUMMARY OF INVENTION

Meanwhile, transition metal-containing silicon compounds are commonly used as the halftone phase shift film material due to processing advantages and chemical stability. For a photomask blank comprising a silicon base halftone phase shift film and a silicon base light-shielding film thereon, it would be desirable to etch away the light-shielding film without damage to the underlying halftone phase shift film. One appropriate solution to this problem was to provide an etching stop film of a selectively etchable material such as chromium base material between the light-shielding film and the halftone phase shift film.

The etching stop film not only permits the light-shielding film to be etched away without damage to the underlying halftone phase shift film, but also enables precise processing of the halftone phase shift film. Inclusion of the etching stop film, however, adds some steps to the process, that is, three etching steps in the order of light-shielding film, etching stop film, and halftone phase shift film are necessary simply for forming a pattern in the halftone phase shift film. When an etching mask film of chromium base material is further used for higher accuracy processing, four etching steps including etching of that etching mask film are necessary for the processing of the halftone phase shift film. When the step of etching away the light-shielding film on the halftone phase shift film is included, five etching steps are necessary even if the technique capable of simultaneously etching different layers is used.

Since the etching step generally tends to produce defects in the mask, the above process using an etching stop film is disadvantageous in that the number of etching steps is increased.

The invention pertains to a photomask or photomask blank comprising a substrate, a phase shift film, and a light-shielding film. An object of the invention is to provide a photomask manufacturing method which enables higher accuracy processing of the light-shielding film and the phase shift film, reduces the number of etching steps involved even when both the light-shielding film and phase shift film include silicon base material layers, and enables selective etching of the light-shielding film on the phase shift film. Another object is to provide a photomask blank from which a photomask can be manufactured by the method. A further object is to provide an etching method capable of selectively etching one of two silicon base material layers.

The number of etching steps may be reduced in several ways. For example, when a photomask blank not having an etching stop film as disclosed in JP-A 2007-241065 is used, patterning of phase shifter is accomplished in a single step because both the light-shielding film and the phase shift film can be processed by fluorine dry etching. However, the light-shielding film on the phase shift film must be removed in order that the phase shifter perform its function. The problem of this stage is whether it is possible to remove only the light-shielding film at a high accuracy selectivity.

With respect to selective etching, the inventors place a focus on chlorine dry etching. JP-A 2001-27799 discloses that MoSiON films can be etched under oxygen-containing chlorine dry etching conditions. It is demonstrated in Examples that an effective etching rate is available at an oxygen content of up to about 20%, and the etching rate moderately slows down as the oxygen content increases. However, it is believed that since the etching rate does not abruptly change, it is difficult to accomplish selective etching by controlling the oxygen content.

Conducting experiments on many test samples to seek for a possibility of selective etching, the inventors have found that if silicon base materials have different contents of oxygen and nitrogen, selective etching between these silicon base materials becomes possible by controlling the amount of oxygen added to etchant gas.

It is provided that the light-shielding film and phase shift film capable of forming high performance films are a phase shift film comprising a silicon base material at least on its side contiguous to the light-shielding film and a light-shielding film including an optional outer layer of chromium base material and a layer of silicon base material formed on the phase shift film, respectively. The phase shift film and the light-shielding film are a combination of a phase shift film of single or multilayer structure including an outermost layer of a silicon base material containing oxygen and/or nitrogen and a transition metal and a light-shielding film of single or multilayer structure including a layer of a silicon base material containing oxygen and/or nitrogen and a transition metal, or a combination of a phase shift film of single or multilayer structure including an outermost layer of a silicon base material containing nitrogen or nitrogen and oxygen and optionally a transition metal and a light-shielding film of single or multilayer structure including a layer of a silicon base material containing nitrogen or nitrogen and oxygen and optionally a transition metal. The silicon base material layers are disposed contiguous to each other. Further a chromium base material layer may be disposed as a fraction of the light-shielding film or as a separate film from the light-shielding film, on the silicon base material layer of the light-shielding film. The inventors have found that if the composition of the silicon base material layers and etching conditions are properly selected, the silicon base material layer of the light-shielding film can be etched together with the chromium base material film by a single chlorine dry etching process, that is, selective etching of the silicon base material layer of the light-shielding film is possible.

The inventors have also found that by incorporating this selective etching in a photomask manufacturing process, a photomask can be manufactured through a reduced number of etching steps and at a high accuracy.

Regarding a laminate comprising a first silicon base material layer of single or multilayer structure containing oxygen and/or nitrogen and optionally a transition metal and a second silicon base material layer of single or multilayer structure disposed contiguous to the first silicon base material layer and containing oxygen and/or nitrogen and optionally a transition metal, a total content of oxygen and nitrogen in the second silicon base material layer being lower than that in the first silicon base material layer, the inventors have found that if the composition of the silicon base material layers and etching conditions are properly selected, the second silicon base material layer can be selectively etched by a single chlorine dry etching process. Regarding the laminate further comprising a chromium base material layer disposed contiguous to the second silicon base material layer, the inventors have found that if etching conditions are properly selected, the second silicon base material layer can be selectively etched together with the chromium base material layer by a single chlorine dry etching process.

The invention provides a method for manufacturing a photomask, a photomask blank, and a dry etching method, as defined below.

[1] A method for manufacturing a photomask comprising the steps of:
  providing a photomask blank comprising
    a transparent substrate,
    a phase shift film thereon comprising a silicon base material at least on its side contiguous to a light-shielding film, and
    a light-shielding film disposed on the phase shift film and including an optional outer layer of chromium base material and a layer of silicon base material,
  said phase shift film and said light-shielding film being a combination of a phase shift film of single or multilayer structure including an outermost layer of a silicon base material containing oxygen and/or nitrogen and a transition metal and a light-shielding film of single or multilayer structure including a layer of a silicon base material containing oxygen and/or nitrogen and a transition metal, or a combination of a phase shift film of single or multilayer structure including an outermost layer of a silicon base material containing nitrogen or nitrogen and oxygen and optionally a transition metal and a light-shielding film of single or multilayer structure including a layer of a silicon base material containing nitrogen or nitrogen and oxygen and optionally a transition metal,
  the silicon base material layer of said phase shift film being disposed contiguous to the silicon base material layer of said light-shielding film, and selectively etching away the silicon base material layer of the light-shielding film disposed on the silicon base material layer of said phase shift film in said photomask blank while retaining the silicon base material layer of said phase shift film, said photomask blank meeting that provided that the silicon base material layer of said phase shift film has a total content C1 (mol %) of nitrogen and oxygen, and the silicon base material layer of said light-shielding film has a total content C2 (mol %) of nitrogen and oxygen, the difference between these total contents (C1−C2) is at least 5, and the etching step including chlorine dry etching using oxygen-containing chlorine gas in a molar ratio of oxygen to chlorine between 0.0001 and 1.

[2] The method of [1] wherein said phase shift film and said light-shielding film are a combination of a phase shift film of single or multilayer structure including an outermost layer of a silicon base material containing oxygen and/or nitrogen and a transition metal and a light-shielding film of single or multilayer structure including a layer of a silicon base material containing oxygen and/or nitrogen and a transition metal.

[3] The method of [1] wherein said phase shift film and said light-shielding film are a combination of a phase shift film of single or multilayer structure including an outermost layer of a silicon base material containing nitrogen or nitrogen and oxygen and optionally a transition metal and a light-shielding film of single or multilayer structure including a layer of a silicon base material containing nitrogen or nitrogen and oxygen and optionally a transition metal.

[4] The method of any one of [1] to [3], further comprising the step of removing the silicon base material layer of the light-shielding film and the silicon base material layer of said phase shift film by fluorine dry etching to form a pattern in the silicon base material layer of said phase shift film, prior to the step of selectively etching away the silicon base material layer of the light-shielding film disposed on the silicon base material layer of said phase shift film in said photomask blank while retaining the silicon base material layer of said phase shift film.

[5] The method of [4] wherein said photomask blank further comprises a chromium base material layer as a fraction of said light-shielding film or an etching mask film of chromium base material as a separate film from said light-shielding film and on said light-shielding film, said method further comprising the steps of patterning the chromium base material layer and patterning the silicon base material layer of said phase shift film using the patterned chromium base material layer as a hard mask.

[6] The method of [5] wherein said photomask blank further comprises a chromium base material layer as a fraction of said light-shielding film, and said chromium base material layer functions as an antireflective film in the photomask.

[7] The method of [5] wherein said photomask blank further comprises an etching mask film of chromium base material as a separate film from said light-shielding film and on said light-shielding film, and said etching mask film is entirely removed in any step after pattern formation of the silicon base material layer of said phase shift film is completed.

[8] The method of any one of [1] to [7] wherein said phase shift film is a halftone phase shift film.

[9] A photomask blank comprising
a transparent substrate,
a phase shift film thereon comprising a silicon base material at least on its side contiguous to a light-shielding film, and
a light-shielding film formed on the phase shift film and including an optional outer layer of chromium base material and a layer of silicon base material, said phase shift film and said light-shielding film being a combination of a phase shift film of single or multilayer structure including an outermost layer of a silicon base material containing oxygen and/or nitrogen and a transition metal and a light-shielding film of single or multilayer structure including a layer of a silicon base material containing oxygen and/or nitrogen and a transition metal, or a combination of a phase shift film of single or multilayer structure including an outermost layer of a silicon base material containing nitrogen or nitrogen and oxygen and optionally a transition metal and a light-shielding film of single or multilayer structure including a layer of a silicon base material containing nitrogen or nitrogen and oxygen and optionally a transition metal, said phase shift film being semitransparent and having a transmittance of 1 to 40% with respect to exposure light, said light-shielding film having a reflectance of up to 30% with respect to exposure light, provided that the silicon base material layer of said phase shift film has a total content C1 (mol %) of nitrogen and oxygen, and the silicon base material layer of said light-shielding film has a total content C2 (mol %) of nitrogen and oxygen, the difference between these total contents (C1−C2) being at least 5.

[10] The photomask blank of [9] wherein said phase shift film and said light-shielding film are a combination of a phase shift film of single or multilayer structure including an outermost layer of a silicon base material containing oxygen and/or nitrogen and a transition metal and a light-shielding film of single or multilayer structure including a layer of a silicon base material containing oxygen and/or nitrogen and a transition metal.

[11] The photomask blank of [9] wherein said phase shift film and said light-shielding film are a combination of a phase shift film of single or multilayer structure including an outermost layer of a silicon base material containing nitrogen or nitrogen and oxygen and optionally a transition metal and a light-shielding film of single or multilayer structure including a layer of a silicon base material containing nitrogen or nitrogen and oxygen and optionally a transition metal.

[12] The photomask blank of any one of [9] to [11] wherein said light-shielding film consists of the silicon base material layer, and said photomask blank further comprises an etching mask film of chromium base material on said light-shielding film.

[13] The photomask blank of any one of [9] to [11] wherein said light-shielding film comprises the silicon base material layer and a chromium base material layer disposed thereon, said chromium base material layer containing one or more elements selected from oxygen, nitrogen and carbon and having a thickness of up to 20 nm.

[14] The photomask blank of any one of [9] to [13] wherein said phase shift film is a halftone phase shift film.

[15] A dry etching method comprising the steps of:
providing a laminate comprising a first silicon base material layer of single or multilayer structure containing oxygen and/or nitrogen and optionally a transition metal and a second silicon base material layer of single or multilayer structure disposed contiguous to the first silicon base material layer and containing optionally a transition metal, a total content of oxygen and nitrogen in the second silicon base material layer being lower than that in the first silicon base material layer, and selectively etching away the second silicon base material layer in the laminate while retaining the first silicon base material layer, the selective etching step being chlorine dry etching using an oxygen-containing chlorine dry etchant gas while selecting a ratio of chlorine to oxygen such that an etching rate of the second silicon base material layer is higher than an etching rate of the first silicon base material layer.

[16] The dry etching method of [15] wherein said second silicon base material layer comprises a silicon base material sublayer containing nitrogen and/or oxygen and optionally a transition metal.

[17] The dry etching method of [16] wherein said second silicon base material layer further comprises another silicon base material sublayer disposed contiguous to the first silicon base material layer, which is free of nitrogen and oxygen and may contain a transition metal.

[18] The dry etching method of [16] or [17] wherein provided that the first silicon base material layer has a total content C1 (mol %) of nitrogen and oxygen, and the silicon base material sublayer containing nitrogen and/or oxygen and optionally a transition metal included in the second silicon base material layer has a total content C2 (mol %) of nitrogen and oxygen, the difference between these total contents (C1−C2) is at least 5.

[19] The dry etching method of any one of [15] to [18] wherein the chlorine dry etching uses oxygen-containing chlorine gas in a molar ratio of oxygen to chlorine between 0.0001 and 1.

[20] The dry etching method of any one of [15] to [19] wherein an experiment is carried out by forming the first silicon base material layer on a substrate, forming the second silicon base material layer or the silicon base material sublayer of the second silicon base material layer on a substrate, dry etching individually the first and second silicon base material layers on substrates with an oxygen-containing chlorine etchant gas, while varying a molar ratio of oxygen to chlorine, thus determining etching rates of the first and second silicon base material layers, the molar ratio of oxygen to chlorine in the etchant gas that permits the second silicon base material layer to be selectively etched from the laminate while retaining the first silicon base material layer is selected by comparing the etching rates, and the chlorine dry etching is carried out at the selected ratio.

[21] The dry etching method of any one of [15] to [20] wherein said laminate further comprises a chromium base material layer disposed contiguous to the second silicon base material layer, and both the chromium base material layer and the second silicon base material layer are removed by the chlorine dry etching.

[22] The dry etching method of any one of [15] to [21] wherein the first and second silicon base material layers are formed on a transparent substrate to constitute functional films for a photomask blank.

[23] The dry etching method of [22] wherein the first silicon base material layer constitutes a fraction or the entirety of a phase shift film of the photomask blank, and the second silicon base material layer constitutes a fraction or the entirety of a light-shielding film of the photomask blank.

Advantageous Effects of Invention

The photomask manufacturing method and the dry etching method are applicable to a laminate comprising layers of analogous silicon base materials, for example, a laminate comprising a phase shift film of a silicon base material overlaid with a light-shielding film of a different silicon base material. The light-shielding film can be etched at a high accuracy without causing damage to the underlying phase shift film. The methods eliminate a need for a so-called etching stop film.

Upon patterning of a lower layer of a multilayer laminate, for example, patterning of a phase shift film, the light-shielding film of silicon base material and the phase shift film of silicon base material can be processed by single dry etching. Where an etching mask film of chromium base material is disposed on an upper layer of a multilayer laminate (for example, the light-shielding film), or where a chromium base material layer having an antireflection function is used as an upper layer of the light-shielding film, the chromium base material film or layer and the silicon base material layer of the light-shielding film can be processed by single dry etching. This process is effective for reducing the number of dry etching steps and hence, preventing generation of mask defects.

DESCRIPTION OF EMBODIMENTS

Figure 1:
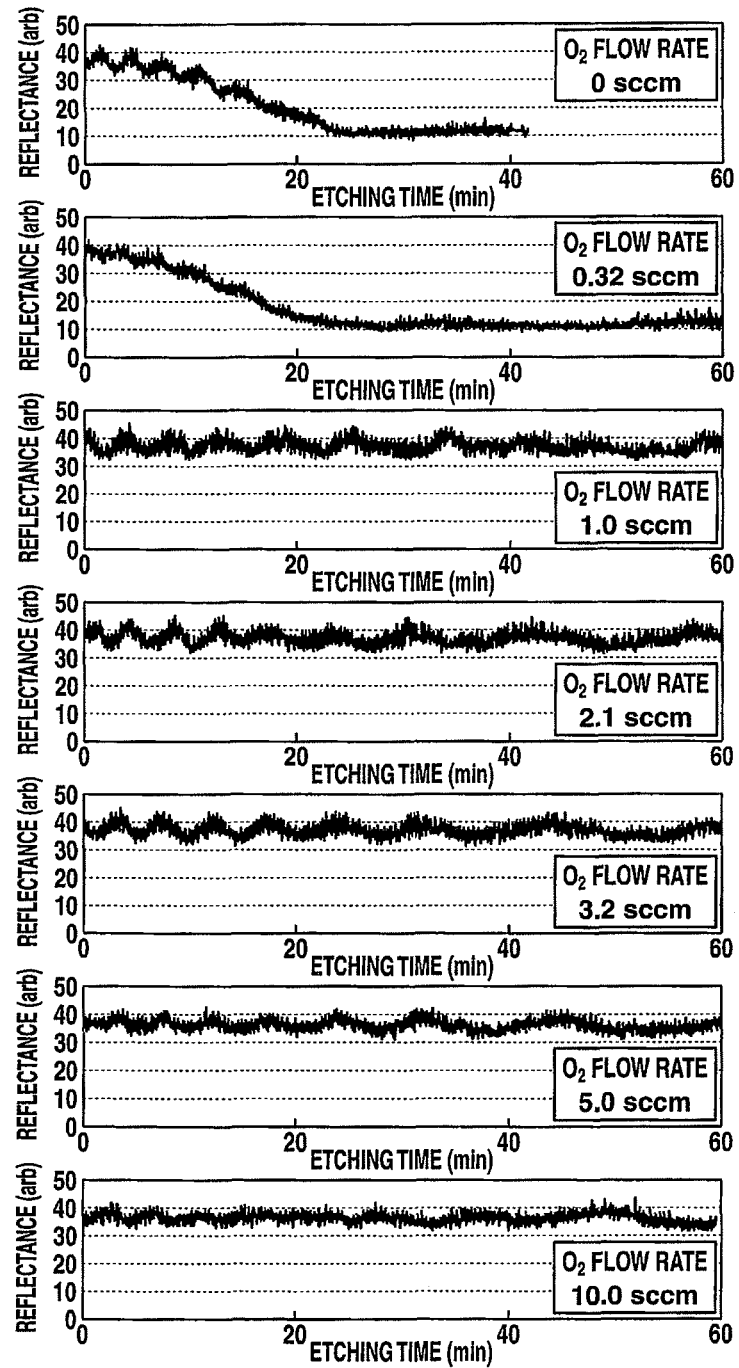
FIG. 1 is a diagram showing film reflectance versus etching time when films are etched at different $O_2$ flow rates in Experiment 1.

In this disclosure, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not.

A photomask blank comprising a transparent substrate, a phase shift film thereon, and a light-shielding film thereon is processed into a photomask comprising a light shield and a phase shifter. On account of the order of deposition of the films, in general, regions of the light-shielding film and the phase shift film where the phase shift film is unnecessary are removed in the described order to form a necessary phase shifter pattern. Then, the unnecessary light-shielding film on the remaining phase shifter pattern is removed to form a light shield pattern, yielding the desired photomask.

For high accuracy processing of phase shifter, it is a common practice in the art to form a light-shielding film and a phase shift film from materials having different etching properties, for example, a light-shielding film from a chromium base material and a phase shift film from a silicon base material optionally containing a transition metal. The light-shielding film of chromium base material is patterned using a photoresist pattern. Using the resultant light shield pattern as an etching mask, the phase shift film of silicon base material is processed. See JP-A 2004-333653, for example.

However, under the circumstance that the desired semiconductor pattern rule is reduced to 65 nm or less as discussed in the preamble, when a chromium film having a necessary thickness to provide light shielding property is used, the pattern accuracy associated with processing of the chromium film is drastically reduced. It is then effective to use a silicon base material optionally containing a transition metal in the main layer of the light-shielding film as well. See JP-A 2007-241065 and JP-A 2007-241060.

When analogous silicon base materials are used in the light-shielding film and phase shift film, the method for manufacturing a photomask involves the step of removing the unnecessary light-shielding film on the phase shift film, which requires a means for selectively etching only the silicon base material of the light-shielding film. It then seems effective that the selective etching method between chromium base material and silicon base material is utilized in the etching of a phase shift film of silicon base material and a light-shielding film of silicon base material, and an etching stop film of chromium base material having different etching properties from the silicon base material is disposed between the phase shift film of silicon base material and the light-shielding film of silicon base material as described in JP-A 2007-241065.

In this case, the method of processing the phase shift film may adopt many variations which are all effective. However, to form a phase shifter pattern as described above, three etching steps in the order of the light-shielding film of silicon base material, the etching stop film of chromium base material and the phase shift film of silicon base material are necessary because etching properties of the etching stop film are different from those of the light-shielding film and the phase shift film. Thus there is a desire for a method capable of selectively etching one silicon base material layer from a laminate of contiguously stacked silicon base material layers without a need for etching stop film.

A method of selectively etching one of two contiguous silicon-containing layers is per se known from JP-A S63-85553. When a transition metal-containing silicon film deposited on a quartz substrate is etched under oxygen-containing chlorine dry etching conditions with silicon oxide ($Si_mO_n$) used as an etching mask, only the transition metal-containing silicon film is selectively etched without causing any damage to the etching mask of silicon oxide and the quartz substrate. However, it is described nowhere how to selectively remove the silicon oxide. Additionally, the silicon oxide used therein is likely to generate foreign matter upon deposition by sputtering and not always convenient to use.

JP-A 2001-27799 discloses processing of a halftone phase shift film. MoSiON film, though its accurate composition is unknown, can be etched under oxygen-containing chlorine dry etching conditions over a considerably wide range of oxygen content. Although this indicates that MoSiON films are etchable under oxygen-containing chlorine dry etching conditions, it is expected difficult to establish selectivity between MoSiON films.

On the other hand, JP-A 2007-241060 discloses a light-shielding film of silicon base material on a phase shift film of silicon base material. Both the films are patterned by a single step of fluorine dry etching. A film of chromium base material on the light-shielding film is also disclosed. An unnecessary portion of the light-shielding film of chromium base material is removed by a dry etching step under different conditions from the silicon base material film.

The invention pertains to a laminate comprising a first silicon base material layer containing oxygen and/or nitrogen and optionally a transition metal and a second silicon base material layer of single layer or multilayer structure including a silicon base material sublayer disposed contiguous to the first silicon base material layer and containing optionally a transition metal, for example, a laminate comprising a first silicon base material layer containing oxygen and/or nitrogen and a transition metal and a second silicon base material layer of single or multilayer structure including a silicon base material sublayer disposed contiguous to the first silicon base material layer and containing oxygen and/or nitrogen and a transition metal, or even a laminate comprising a first silicon base material layer containing nitrogen or nitrogen and oxygen and optionally a transition metal and a second silicon base material layer of single or multilayer structure including a silicon base material sublayer disposed contiguous to the first silicon base material layer and containing nitrogen or nitrogen and oxygen and optionally a transition metal. According to the invention, a proper combination of the first silicon base material layer with the second silicon base material layer eliminates a need for an etching stop film of chromium base material therebetween and ensures that the second silicon base material layer on the first silicon base material layer is selectively removed by dry etching while maintaining the first silicon base material layer intact.

In a preferred embodiment of the laminate comprising a first silicon base material layer and a second silicon base material layer, these layers are layers constituting functional films on a transparent substrate such as a light-shielding film, phase shift film and other functional film of a photomask blank. In a more preferred embodiment, the first silicon base material layer is a layer constituting a fraction or the entirety of the phase shift film of the photomask blank, and the second silicon base material layer is a layer constituting a fraction or the entirety of the light-shielding film of the photomask blank.

In an exemplary photomask blank comprising a phase shift film disposed on a transparent substrate and a light-shielding film disposed on the phase shift film, both the phase shift film and the light-shielding film include silicon base material layers which contain oxygen and/or nitrogen and may contain a transition metal, for example, silicon base material layers which contain oxygen and/or nitrogen and a transition metal, or silicon base material layers which contain nitrogen or nitrogen and oxygen and may contain a transition metal, and the silicon base material layers of the phase shift film and the light-shielding film are disposed contiguous to each other (in direct contact without any intervening film). Even in this embodiment, a proper combination of the silicon base material layer of the phase shift film as the first silicon base material layer with the silicon base material layer of the light-shielding film as the second silicon base material layer eliminates a need for an etching stop film of chromium base material therebetween and ensures that the silicon base material layer of the light-shielding film on the silicon base material layer of the phase shift film is selectively removed by dry etching while maintaining intact the silicon base material layer of the phase shift film.

The light-shielding film may include a silicon base material layer which does not contain oxygen and nitrogen and may contain a transition metal. Where the silicon base material layer which does not contain oxygen and nitrogen and may contain a transition metal is disposed on the side of the light-shielding film contiguous to the phase shift film, the silicon base material layers containing oxygen and/or nitrogen and optionally a transition metal of the phase shift film and light-shielding film, for example, silicon base material layers containing oxygen and/or nitrogen and a transition metal, or silicon base material layers containing nitrogen or nitrogen and oxygen and optionally a transition metal may be disposed adjacent to each other via this silicon base material layer which does not contain oxygen and nitrogen and may contain a transition metal. In this embodiment, in order that the entire light-shielding film be selectively removed by single dry etching with respect to the phase shift film in accordance with the selectivity mechanism of the invention, it is important that the silicon base material layer containing oxygen and/or nitrogen and optionally a transition metal included in the light-shielding film, for example, a silicon base material layer containing oxygen and/or nitrogen and a transition metal or a silicon base material layer containing nitrogen or nitrogen and oxygen and optionally a transition metal, be properly combined with the silicon base material layer containing oxygen and/or nitrogen and optionally a transition metal included as the outermost layer in the phase shift film, for example, a silicon base material layer containing oxygen and/or nitrogen and a transition metal or a silicon base material layer containing nitrogen or nitrogen and oxygen and optionally a transition metal, and dry etching conditions be properly selected.

The method of the invention accomplishes a high accuracy of processing and eliminates an etching stop film between a silicon base material layer of the phase shift film as the first silicon base material layer and a silicon base material layer of the light-shielding film as the second silicon base material layer. Then the silicon base material layer of the phase shift film and the silicon base material layer of the light-shielding film can be processed by a common fluorine dry etching step. In this regard, the method is advantageous in reducing the number of steps.

In a further embodiment of the invention relating to a combination of light-shielding film and phase shift film that insures an antireflection function and provides high-performance films, a silicon base material layer containing oxygen and/or nitrogen and optionally a transition metal, specifically a silicon base material layer containing oxygen and/or nitrogen and a transition metal or a silicon base material layer containing nitrogen or nitrogen and oxygen and optionally a transition metal is included in the light-shielding film, and a silicon base material layer containing oxygen and/or nitrogen and optionally a transition metal, specifically a silicon base material layer containing oxygen and/or nitrogen and a transition metal or a silicon base material layer containing nitrogen or nitrogen and oxygen and optionally a transition metal is included as the outermost layer in the phase shift film. Further a chromium base material film on the silicon base material layer of the light-shielding film is included as a fraction of the light-shielding film or as a separate film from the light-shielding film. In this embodiment, as long as the composition of the silicon base material layers and etching conditions are properly selected, the silicon base material layer of the light-shielding film can be etched together with the chromium base material film by a single chlorine dry etching process. Thus the silicon base material layer of the light-shielding film can be selectively etched.

For a laminate comprising a first silicon base material layer containing oxygen and/or nitrogen and optionally a transition metal (i.e., containing or not containing a transition metal), specifically a first silicon base material layer containing oxygen and/or nitrogen and a transition metal or a first silicon base material layer containing nitrogen or nitrogen and oxygen and optionally a transition metal (i.e., containing or not containing a transition metal), which corresponds to a silicon base material layer of the phase shift film, and a second silicon base material layer, which corresponds to a silicon base material layer of the light-shielding film, selective etching conditions may be determined by the following procedure, for example.

First, a silicon base material is deposited to form a film of a predetermined thickness on a substrate, typically a quartz substrate used as a photomask substrate. This silicon base material film is subjected to experiments of dry etching with an oxygen-containing chlorine gas while varying the oxygen gas content (or a ratio of oxygen to chlorine gas). In these experiments, an etching clear time is determined, from which an etching rate relative to an oxygen content is computed.

The etching clear time may be determined by measuring the reflectance of the silicon base material film in the course of etching. Alternatively, it may be determined by visual inspection if the silicon base material film is observable in the course of etching, or by analysis of ions or elements in the plasma, specifically emission spectroscopic analysis of the plasma in the etching chamber. Besides the etching clear time, another route may be taken for determining an etching rate. The silicon base material film is etched for a certain time while a part thereof is masked. Thereafter, a film thickness etched away is measured by a probe film thickness gauge, transmittance measurement, or optical measurement such as an ellipsometer, and an etching rate is computed therefrom. These routes may be used in combination.

The chlorine dry etching process as applied herein uses chlorine gas ($Cl_2$) with oxygen added and may be performed typically under ordinary dry etching conditions as used in the etching of chromium base material films of photomask blanks while adjusting the amount of oxygen added (or the ratio of oxygen/chlorine gas).

Specifically, the molar ratio of oxygen/chlorine gas is preferably adjusted in a range of 0.0001/1 to 1/1, more preferably 0.0003 to 0.5, and even more preferably 0.0005 to 0.3. More specifically, suitable parameters include a chlorine gas flow rate of 100 to 300 sccm (standard cubic centimeter per minute), an oxygen gas flow rate of 0.1 to 100 sccm, and a gas pressure of 1 to 10 mTorr. Helium gas may be added to the chlorine gas at a flow rate of 1 to 20 sccm.

JP-A 2001-27799 discloses that upon dry etching of MoSiON film, the etching rate moderately slows down as the amount of oxygen added to chlorine dry etchant gas is increased. Nevertheless, the chlorine dry etching process is applicable to a laminate of two contiguous silicon base material layers. If the total content of oxygen and nitrogen differs between the layers, specifically if the total content of oxygen and nitrogen in the second silicon base material layer (or silicon base material layer of the light-shielding film) is lower than the total content of oxygen and nitrogen in the first silicon base material layer (or silicon base material layer of the phase shift film), then a selectivity of chlorine dry etching is provided.

Specifically, it suffices that the total content of oxygen and nitrogen differs significantly between the first silicon base material layer and the second silicon base material layer (or silicon base material sublayer constituting the second silicon base material layer), for example, between a silicon base material layer of the phase shift film and a silicon base material layer of the light-shielding film. More specifically, provided that the first silicon base material layer (or silicon base material layer of the phase shift film) has a total content C1 (mol %) of nitrogen and oxygen, and the second silicon base material layer (or silicon base material layer of the light-shielding film) has a total content C2 (mol %) of nitrogen and oxygen, the difference between these total contents (C1−C2) should be at least 5, preferably at least 10, and more preferably at least 20. Then, if the amount of oxygen added to chlorine etchant gas is adjusted as appropriate, the etching rate of the second silicon base material layer (or silicon base material layer of the light-shielding film) is higher than the etching rate of the first silicon base material layer (or silicon base material layer of the phase shift film), preferably an etching rate difference of at least 10 folds is established. That is, an etching rate difference sufficient for selectivity is available.

It is noted that the laminate of a first silicon base material layer and a second silicon base material layer (specifically a photomask blank comprising a phase shift film of silicon base material and a light-shielding film of silicon base material in stack), to which the dry etching method of the invention is advantageously applied, preferably further comprises a chromium base material layer thereon as will be described later. In this embodiment, it is preferable that the chromium base material layer and the second silicon base material layer are simultaneously etched away. A molar ratio of oxygen to chlorine gas within the above-defined range enables simultaneous etching of these layers.

The dry etching process is advantageously applicable when a photomask blank is processed into a photomask.

First, to selectively etch the light-shielding film in a single step utilizing the selectivity of the dry etching process, it is necessary independent of whether the light-shielding film includes a single silicon base material layer or multiple silicon base material layers, to have a significant difference in etching rate between the silicon base material layer of the phase shift film and the silicon base material layer or layers of the light-shielding film. Then the light-shielding film used herein is designed such that for all the silicon base material layers of the light-shielding film, the total content of nitrogen and oxygen has a difference in the above-defined range from the silicon base material layer of the phase shift film.

The photomask blank of the invention is preferably modified so as to enable precise processing even using a thinner resist film. For example, an etching mask film of chromium base material which are stripped in entirety at the time of photomask completion as described in JP-A 2007-241060 is formed on the light-shielding film as a separate film or a layer of chromium base material having an etching mask function relative to the silicon base material and preferably an antireflection function is formed as a fraction of the light-shielding film. Notably, an etching mask film of the type that is used as an etching mask for precise processing and stripped in entirety until the photomask is completed is simply referred to as "etching mask film," hereinafter.

As one preferred embodiment of the light-shielding film used in the photomask blank, a light-shielding film combined with an etching mask film is described.

The etching mask film of chromium base material preferably has a thickness of up to 20 nm, more preferably up to 10 nm for high accuracy etching process because a thicker film raises problems of side etching and pattern density dependency (or proximity bias) as pointed out in JP-A 2007-241060. The preferred material of which the etching mask film is made is metallic chromium or a material containing chromium and one or more light elements selected from oxygen, nitrogen and carbon.

The preferred composition of chromium base material consists essentially of 50 at % to 100 at %, specifically 60 at % to 100 at % of chromium, 0 at % to 50 at %, specifically 0 at % to 40 at % of oxygen, 0 at % to 50 at %, specifically 0 at % to 40 at % of nitrogen, and 0 at % to 20 at %, specifically 0 at % to 10 at % of carbon. Within this range, the chromium base material forms an etching mask film that ensures a high selectivity in fluorine dry etching between the etching mask film and the light-shielding film and phase shift film.

To prevent any failure of resist pattern formation, at least the outermost surface layer of the etching mask film in contact with the resist should preferably contain oxygen and/or nitrogen in a concentration of at least about 5 at %. To this end, oxygen and/or nitrogen may be introduced in the film during deposition by sputtering, or the film as deposited may be oxidized on its surface to tailor the oxygen concentration of the outermost surface layer.

In this embodiment of the photomask blank, a silicon base material layer or layers are used as the entirety of the light-shielding film. The reflectance of the film with respect to exposure light may be controlled in accordance with the content of nitrogen or nitrogen and oxygen, the film thickness or both. Where an etching mask film is used, a high accuracy of processing is ensured even when the silicon base material layer is relatively thick. It then suffices that the light-shielding film combined with the underlying phase shift film has an optical density of at least 2, preferably from 2.5 to 4. A wide variety of materials may meet this requirement.

The light-shielding film may be a single layer or a multilayer (a layer compositionally graded in thickness direction is also referred to as multilayer) as long as the above requirement is met. Some layers may consist of silicon or silicon and a transition metal. To adjust the reflectance, a layer containing oxygen and/or nitrogen must be provided. However, the layer containing oxygen and/or nitrogen should have a lower nitrogen and oxygen content than the nitrogen and oxygen content of the silicon base material layer as the outermost layer of the phase shift film, as described above. The light-shielding film is preferably controlled to a reflectance of up to 30%, more preferably up to 20% with respect to exposure light.

The material of which the silicon base material layer containing oxygen and/or nitrogen and optionally a transition metal included in the light-shielding film is made is a silicon compound which contains at least one of oxygen and nitrogen as well as silicon, may contain a transition metal, and may further contain a minute amount of carbon or the like. Exemplary silicon compounds are silicon oxide, silicon nitride, silicon oxynitride, silicon oxycarbide, silicon nitride carbide, and silicon oxide nitride carbide, and the foregoing compounds further containing a transition metal.

The material of which the silicon base material layer containing oxygen and/or nitrogen and a transition metal or the silicon base material layer containing nitrogen or nitrogen and oxygen and optionally a transition metal included in the light-shielding film is made is, in the former case, a silicon compound which contains at least one of oxygen and nitrogen as well as transition metal and silicon, and may further contain a minute amount of carbon or the like. Exemplary silicon compounds are transition metal silicon oxide, transition metal silicon nitride, transition metal silicon oxynitride, transition metal silicon oxycarbide, transition metal silicon nitride carbide, and transition metal silicon oxide nitride carbide. In the latter case, it is a silicon compound which contains silicon and nitrogen, may further contain a transition metal and oxygen, and may further contain a minute amount of carbon or the like. Exemplary silicon compounds are silicon nitride, silicon oxynitride, silicon nitride carbide, silicon oxide nitride carbide, transition metal silicon nitride, transition metal silicon oxynitride, transition metal silicon nitride carbide, and transition metal silicon oxide nitride carbide.

In addition to the foregoing silicon base material layer, silicon alone, transition metal silicon, silicon carbide, or transition metal silicon carbide may be added as another silicon base material layer to constitute the light-shielding film.

The transition metal is preferably selected from among titanium, vanadium, cobalt, nickel, zirconium, niobium, molybdenum, hafnium, tantalum, and tungsten, and mixtures of two or more of the foregoing. Inter alia, molybdenum is preferred from the standpoint of dry etching.

The preferred composition of the light-shielding film consists essentially of 10 at % to 100 at %, specifically 30 at % to 95 at % of silicon, 0 at % to 50 at %, specifically 0 at % to 30 at % of oxygen, 0 at % to 40 at %, specifically 1 at % to 20 at % of nitrogen, a total of nitrogen and oxygen being 0 at % to 60 at %, preferably 0 at % to 50 at %, more preferably 1 at % to 40 at %, even more preferably 1 at % to 30 at %, 0 at % to 20 at %, specifically 0 at % to 5 at % of carbon, and 0 at % to 35 at %, specifically 1 at % to 20 at % of transition metal.

Particularly in the case of a silicon compound containing oxygen and/or nitrogen and a transition metal, the preferred composition consists essentially of 10 at % to 95 at %, specifically 30 at % to 95 at % of silicon, 0 at % to 50 at %, specifically 0 at % to 30 at % of oxygen, 0 at % to 40 at %, specifically 0 at % to 20 at % of nitrogen, a total of nitrogen and oxygen being 1 at % to 60 at %, specifically 1 at % to 50 at %, more specifically 1 at % to 40 at %, even more specifically 1 at % to 30 at %, 0 at % to 20 at %, specifically 0 at % to 5 at % of carbon, and 1 at % to 35 at %, specifically 1 at % to 20 at % of transition metal.

Particularly in the case of a silicon compound containing nitrogen or nitrogen and oxygen and optionally a transition metal, the preferred composition consists essentially of 10 at % to 95 at %, specifically 30 at % to 95 at % of silicon, 0 at % to 50 at %, specifically 0 at % to 30 at % of oxygen, 1 at % to 40 at %, specifically 1 at % to 20 at % of nitrogen, 0 at % to 20 at %, specifically 0 at % to 5 at % of carbon, and 0 at % to 35 at %, specifically 1 at % to 20 at % of transition metal.

In another preferred embodiment of the light-shielding film used in the photomask blank, the light-shielding film includes a chromium base material layer contributing to an antireflection function as the outermost layer and as a fraction of the light-shielding film. The preferred material of the chromium base material layer is metallic chromium or a material containing chromium and one or more light elements selected from oxygen, nitrogen and carbon.

Like the etching mask film, the chromium base material layer formed as the outermost layer of the light-shielding film has the risk that a thicker film raises problems of side etching and pattern density dependency (or proximity bias). Then preferably the thickness of the chromium base material layer should not exceed the necessity. Thus in this case too, the film thickness is preferably up to 30 nm, more preferably up to 20 nm, and even more preferably up to 10 nm. In case only the film intended for antireflection function (i.e., the film contributing mainly to antireflection function) is insufficient as the hardmask layer, the chromium base material layer may be provided as multilayer structure, typically two layers: a layer intended for antireflection function (i.e., layer contributing mainly to antireflection function) and a layer intended for hardmask function (i.e., layer contributing mainly to hardmask function), or the chromium base material layer may be compositionally graded. Of graded layers, a layer having a higher metal content on the substrate side than on the surface side is preferred.

The outermost layer is preferably a layer contributing to part of antireflection function. Then the outermost layer preferably contains oxygen and/or nitrogen.

The preferred composition of the layer intended for antireflection function consists essentially of 30 at % to 90 at %, specifically 30 at % to 70 at %, more specifically 35 at % to 50 at % of chromium, 0 at % to 60 at %, specifically 20 at % to 60 at % of oxygen, 0 at % to 50 at %, specifically 3 at % to 30 at % of nitrogen, and 0 at % to 20 at %, specifically 0 at % to 10 at % of carbon. The preferred composition of the layer intended for hardmask function consists essentially of 50 at % to 100 at %, specifically 60 at % to 100 at % of chromium, 0 at % to 50 at %, specifically 0 at % to 40 at % of oxygen, 0 at % to 50 at %, specifically 0 at % to 40 at % of nitrogen, and 0 at % to 20 at %, specifically 0 at % to 10 at % of carbon.

In the above embodiment wherein the light-shielding film used in the photomask blank includes a chromium base material layer, all the remaining layers other than the chromium base material layer are silicon base material layers. The chromium base material layer may serve as such to control reflectance, but its thickness is limited from the standpoint of high accuracy processing. Then, reflectance may be controlled by combining the chromium base material layer with a silicon base material layer. The silicon base material layer of the light-shielding film may be either a single layer or a multilayer structure, or a compositionally graded layer while the reflectance of the film may be adjusted in accordance with the content of nitrogen or nitrogen and oxygen, the film thickness, or both. By combining the silicon base material layer with chromium base material layer, the reflectance of the film is preferably controlled to 30% or below, more preferably 20% or below with respect to exposure light. These layers are also designed such that the light-shielding film combined with the underlying phase shift film may have an optical density of at least 2, preferably 2.5 to 4.

Like the foregoing embodiment, the silicon base material layer may consist of silicon or silicon and a transition metal. To suppress reflectance, a layer containing nitrogen or nitrogen and oxygen is necessary. As described above, the layer containing nitrogen or nitrogen and oxygen is designed to have a lower content of nitrogen and oxygen than the silicon base material layer as the outermost layer of the phase shift film. Then better results are obtained when silicon base materials containing nitrogen or nitrogen and oxygen (silicon nitride material or silicon oxynitride material) are used for all the layers.

The preferred material used herein is generally the same as in the foregoing embodiment. Referring to the compositional range, the preferred composition of the light-shielding film consists essentially of 10 at % to 100 at %, specifically 30 at % to 95 at % of silicon, 0 at % to 50 at %, specifically 0 at % to 30 at % of oxygen, 0 at % to 40 at %, specifically 1 at % to 20 at % of nitrogen, a total of nitrogen and oxygen being 0 at % to 60 at %, specifically 0 at % to 50 at %, more specifically 1 at % to 40 at %, even more specifically 1 at % to 30 at %, 0 at % to 20 at %, specifically 0 at % to 5 at % of carbon, and 0 at % to 35 at %, specifically 1 at % to 20 at % of transition metal.

Particularly in the case of a silicon compound containing oxygen and/or nitrogen and a transition metal, the preferred composition consists essentially of 10 at % to 95 at %, specifically 30 at % to 95 at % of silicon, 0 at % to 50 at %, specifically 0 at % to 30 at % of oxygen, 0 at % to 40 at %, specifically 0 at % to 20 at % of nitrogen, a total of nitrogen and oxygen being 1 at % to 60 at %, specifically 1 at % to 50 at %, more specifically 1 at % to 40 at %, even more specifically 1 at % to 30 at %, 0 at % to 20 at %, specifically 0 at % to 5 at % of carbon, and 1 at % to 35 at %, specifically 1 at % to 20 at % of transition metal.

Particularly in the case of a silicon compound containing nitrogen or nitrogen and oxygen and optionally a transition metal, the preferred composition consists essentially of 10 at % to 95 at %, specifically 30 at % to 95 at % of silicon, 0 at % to 50 at %, specifically 0 at % to 30 at % of oxygen, 1 at % to 40 at %, specifically 1 at % to 20 at % of nitrogen, 0 at % to 20 at %, specifically 0 at % to 5 at % of carbon, and 0 at % to 35 at %, specifically 1 at % to 20 at % of transition metal.

The phase shift film is a film including a silicon base material layer having chemical resistance and excellent optical properties such as refractive index as the outermost layer.

This silicon base material is a material containing oxygen and/or nitrogen and optionally a transition metal, for example, a silicon base material containing oxygen and/or nitrogen and a transition metal or a silicon base material containing nitrogen or nitrogen and oxygen and optionally a transition metal. The phase shift film may be either a full transmission phase shift film or a halftone phase shift film, for example, a halftone phase shift film having a transmittance of 1 to 40%, specifically 5 to 40%. As the phase shift film, a variety of films are known. In particular, a halftone phase shift film of single layer structure (e.g., described in JP-A H07-140635) or multilayer structure (e.g., described in JP-A 2006-317665), made of transition metal-containing silicon base material, may be used as the phase shift film which can be etched together with the light-shielding film by a single dry etching process. Such a film may be advantageously used for the purpose of reducing the number of dry etching steps.

Among the halftone phase shift film materials used in the art, some materials can be etched by a chlorine dry etching process as described in JP-A 2001-27799. The phase shift film used herein may be a film which is etched under chlorine dry etching conditions as defined in JP-A 2001-27799. According to the invention, an etching selectivity may be established between the phase shift film and the light-shielding film by adjusting the content of oxygen gas in the etchant gas (specifically oxygen/chlorine gas ratio) during etching. Then the silicon base material for the phase shift film is preferably selected from the standpoints of the stress, laser radiation resistance, and optical properties of the phase shift film.

The material of which the silicon base material layer containing oxygen and/or nitrogen and optionally a transition metal included in the phase shift film is made is a silicon compound which contains silicon and at least one element selected from oxygen and nitrogen, may contain a transition metal, and may further contain a minute amount of carbon or the like. Exemplary silicon compounds are silicon oxide, silicon nitride, silicon oxynitride, silicon oxycarbide, silicon nitride carbide, and silicon oxide nitride carbide, and the foregoing compounds further containing a transition metal. In addition to the foregoing silicon base material layer, silicon alone, transition metal silicon, silicon carbide, or transition metal silicon carbide may be added as another silicon base material layer to constitute the phase shift film.

The material of which the silicon base material layer containing oxygen and/or nitrogen and a transition metal or the silicon base material layer containing nitrogen or nitrogen and oxygen and optionally a transition metal included in the phase shift film is made is, in the former case, a silicon compound which contains at least one of oxygen and nitrogen as well as transition metal and silicon, and may further contain a minute amount of carbon or the like. Exemplary silicon compounds are transition metal silicon oxide, transition metal silicon nitride, transition metal silicon oxynitride, transition metal silicon oxycarbide, transition metal silicon nitride carbide, and transition metal silicon oxide nitride carbide. In the latter case, it is a silicon compound which contains silicon and nitrogen, may further contain a transition metal and oxygen, and may further contain a minute amount of carbon or the like. Exemplary silicon compounds are silicon nitride, silicon oxynitride, silicon nitride carbide, silicon oxide nitride carbide, transition metal silicon nitride, transition metal silicon oxynitride, transition metal silicon nitride carbide, and transition metal silicon oxide nitride carbide.

In addition to the foregoing silicon base material layer, silicon alone, a silicon compound containing silicon and one or more elements selected from oxygen, nitrogen and carbon, or a similar silicon compound further containing a transition metal silicon may be added as another silicon base material layer to constitute the phase shift film. Exemplary silicon compounds are silicon oxide, silicon nitride, silicon oxynitride, silicon oxycarbide, silicon nitride carbide, silicon oxide nitride carbide, and the foregoing compounds further containing a transition metal.

The transition metal is preferably selected from among titanium, vanadium, cobalt, nickel, zirconium, niobium, molybdenum, hafnium, tantalum, and tungsten, and mixtures of two or more of the foregoing. Inter alia, molybdenum is preferred from the standpoint of dry etching.

In the phase shift film, at least the layer disposed contiguous to the light-shielding film (i.e., outermost layer) is preferably a silicon base material layer containing oxygen and/or nitrogen and optionally a transition metal, specifically a silicon base material layer containing oxygen and/or nitrogen and a transition metal or a silicon base material layer containing nitrogen or nitrogen and oxygen and optionally a transition metal. On the side contiguous to the substrate, a chromium base material layer may be used as long as it has a thickness sufficient to avoid the side etching problem, for example, up to 30 nm, preferably up to 20 nm. The chromium base material disposed on the substrate side does not add to the etching step because it can be etched away at the same time when the etching mask film or a film having an etching mask function as the outermost layer of the light-shielding film is etched in the course of photomask manufacture.

The method of processing a photomask blank into a photomask involves the following sequence of steps, for example.

A first step is to form a resist pattern for protecting a region of the phase shift film to be left as phase shifter. To this end, a resist material is coated on the photomask blank. The resist film is then subjected to patternwise exposure to high-energy radiation such as electron beam, short-wavelength light beam, or EUV, post treatment (dependent on the resist film), and development, yielding a resist pattern. The resist material used herein may be negative or positive as long as it is capable of resolution to the desired pattern rule. The composition is not particularly limited, but is typically a chemically amplified resist composition which is expected to have a high resolution. The resist film preferably has a thickness of 50 nm to 250 nm, more preferably 50 nm to 150 nm.

Next, in the embodiment wherein an etching mask film of chromium base material is disposed on the silicon base material layer of the light-shielding film, or wherein a chromium base material layer having an antireflection function is included as a fraction of the light-shielding film, dry etching with oxygen-containing chlorine gas is carried out for transferring the resist pattern to the chromium base material layer.

The dry etching with oxygen-containing chlorine gas is often used in the art when chromium compound films are dry etched. For example, chlorine ($Cl_2$) gas and oxygen ($O_2$) gas may be mixed in a volume flow rate ratio ($Cl_2$:$O_2$) from 1:2 to 20:1, and an inert gas such as helium may be admixed if necessary. Suitable etching conditions include a chlorine gas flow rate of 100 to 300 sccm, an oxygen gas flow rate of 30 to 100 sccm, and a gas pressure of 1 to 10 mTorr. Helium gas may be added at a flow rate of 1 to 20 sccm.

During this dry etching, the etching mask film or the silicon base material layer disposed contiguous to the chromium base material layer as a fraction of the light-shielding film may be partially etched away. If an attempt is made to completely remove the silicon base material layer by this dry etching, the problem of pattern size errors may arise due to side etching and pattern density dependency. Then dry etching with oxygen-containing chlorine gas is preferably terminated under such conditions that the etching mask film or the silicon base material layer contiguous to the chromium base material layer as a fraction of the light-shielding film is partly left behind.

Next, dry etching with fluorine dry etchant gas is carried out. In the embodiment wherein the etching mask film of chromium base material is absent or wherein the chromium base material layer having an antireflection function as a fraction of the light-shielding film is absent, the resist pattern is used as an etching mask. In the embodiment wherein the etching mask film of chromium base material to which the pattern has been transferred is present or wherein the chromium base material layer having an antireflection function as a fraction of the light-shielding film is present, that film or layer is used as an etching mask. By fluorine dry etching, the pattern is transferred to the entire silicon base material layer of the light-shielding film or the remaining silicon base material layer of the light-shielding film and the silicon base material layer of the phase shift film. It is understood that the resist film may be stripped at this stage although it is not necessary to strip the resist film. If the resist film is left, the remaining resist pattern may also function as an etching mask.

In the embodiment wherein the phase shift film consists of a silicon base material layer containing oxygen and/or nitrogen and optionally a transition metal, specifically a silicon base material layer containing oxygen and/or nitrogen and a transition metal or a silicon base material layer containing nitrogen or nitrogen and oxygen and optionally a transition metal, or further includes a metal layer of Ta, W, Ti or the like which is etchable by the fluorine dry etching process, a metal compound layer containing such a metal and oxygen and/or nitrogen, or a layer consisting of silicon or silicon and a transition metal, a pattern of phase shifter can also be formed by the fluorine dry etching process. Therefore, even when a layer having an etching mask function is used, the method for manufacturing a photomask according to the invention involves only two dry etching steps until the completion of a phase shifter pattern.

The fluorine dry etching process used herein is one of dry etching processes which are commonly used in the etching of silicon-containing materials during the manufacture of photomasks. It is dry etching with a fluorine-containing gas. Suitable fluorine-containing gases include gases containing fluorine, for example, fluorine gas, gases containing carbon and fluorine (e.g., $CF_4$ or $C_2F_6$), gases containing sulfur and fluorine (e.g., $SF_6$), the foregoing gases further containing hydrogen, and mixtures of a fluorine-free gas (e.g., helium) and a fluorine-containing gas. Another gas such as oxygen may be added thereto, if necessary. Suitable etching conditions include a ratio of oxygen gas to fluorine-containing gas (specifically a molar ratio of oxygen/fluorine) from 0.001 to 1000, and specifically a fluorine-containing gas flow rate of 1 to 1,000 sccm, preferably 10 to 100 sccm, an oxygen gas flow rate of 1 to 1,000 sccm, preferably 10 to 100 sccm, and a gas pressure of 1 to 20 mTorr.

Next, if the resist pattern is left at the end of the foregoing steps, the resist pattern is completely stripped, and then a new resist film is deposited for protecting a region of the light-shielding film to be retained as a light-shield pattern. In accordance with the aforementioned procedure, the resist film is processed so as to form a resist pattern on the region of the light-shielding film to be retained.

Next, using the resist pattern as an etching mask, dry etching with oxygen-containing chlorine gas is carried out under conditions that provide a substantially retarded etching rate to the outermost layer of the phase shift film. The unnecessary region of the light-shielding film on the phase shift film is thus removed. In the embodiment wherein the etching mask film of chromium base material or the chromium base material layer constituting a fraction of the light-shielding film is present, such a film or layer can be simultaneously etched away at this point.

In the embodiment wherein the etching mask film of chromium base material or the chromium base material layer having an antireflection function as a fraction of the light-shielding film is absent, pattern processing may be completed at this point. In this embodiment, pattern formation is completed through two dry etching steps. In the embodiment wherein the chromium base material layer having an antireflection function as a fraction of the light-shielding film is present, pattern formation is completed through three dry etching steps.

In the embodiment wherein the etching mask film of chromium base material is present, this etching mask film must be finally removed. Removal of the etching mask film of chromium base material may be carried out by a well-known wet etching process with ammonium cerium nitrate and perchloric acid, or a dry etching process under chlorine dry etching conditions containing a sufficient amount of oxygen to provide a substantially retarded etching rate to the silicon base material layer. Even when the dry etching process is used at this point, pattern formation is completed through four dry etching steps.

EXAMPLE

Experiments and Examples are given below for further illustrating the invention although the invention is not limited thereto. The acronym RIE stands for reactive ion etching, ICP for inductively coupled plasma, and CW for continuous wave.

Experiment 1

Figure 4:
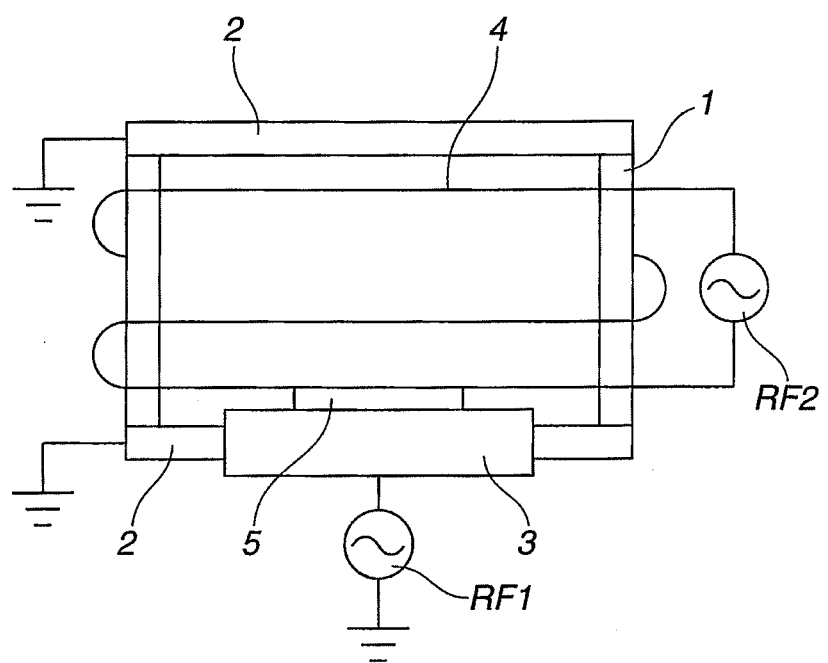
FIG. 4 schematically illustrates a dry etching system used in Experiments and Examples.

A silicon base material film of MoSiON (Mo:Si:O:N molar ratio=1:4:1:4 and total oxygen and nitrogen content=50 mol %) having a thickness of 75 nm and exhibiting a transmittance of 6% and a phase shift of 180° with respect to light of 193 nm wavelength was deposited on a quartz substrate. The film was subjected to chlorine dry etching. To evaluate an oxygen content in etchant gas and an etching rate under chlorine dry etching conditions, chlorine dry etching was carried out under the following conditions and at a flow rate of oxygen varying from 0 to 10.0 sccm. A reflectance of the film with respect to inspection light of 675 nm wavelength was measured over the etching time. The results are plotted in a diagram of FIG. 1. FIG. 4 shows an outline of an etching system used herein including a chamber 1, ground plates 2, a lower electrode 3, an antenna coil 4, a substrate to be treated 5, and radio frequency power sources RF1 and RF2.

RF1 (RIE): pulse 700 V
RF2 (ICP): CW discharge 400 W
Pressure: 6 mTorr
$Cl_2$: 185 sccm
$O_2$: 0-10.0 sccm
He: 9.25 sccm FIG. 1 shows a change of reflectance with dry etching time, indicating that the reflectance on the film surface is about 40 prior to etching, declines in the course of etching, and reaches about 10 at the end of film etching. It is also seen that the MoSiON film having a total content of oxygen and nitrogen of 50 mol % is little etched when the oxygen flow rate in the dry etchant gas is at least 1 sccm (corresponding to an oxygen/chlorine molar ratio of at least 1/185).

Experiment 2

The film tested was a silicon base material film of MoSiN (Mo:Si:N molar ratio=1:3:1.5 and total oxygen and nitrogen content=27 mol %) having a thickness of 46 nm. As in Experiment 1, a change of reflectance with time was measured. The results are plotted in a diagram of FIG. 2.

Figure 2:
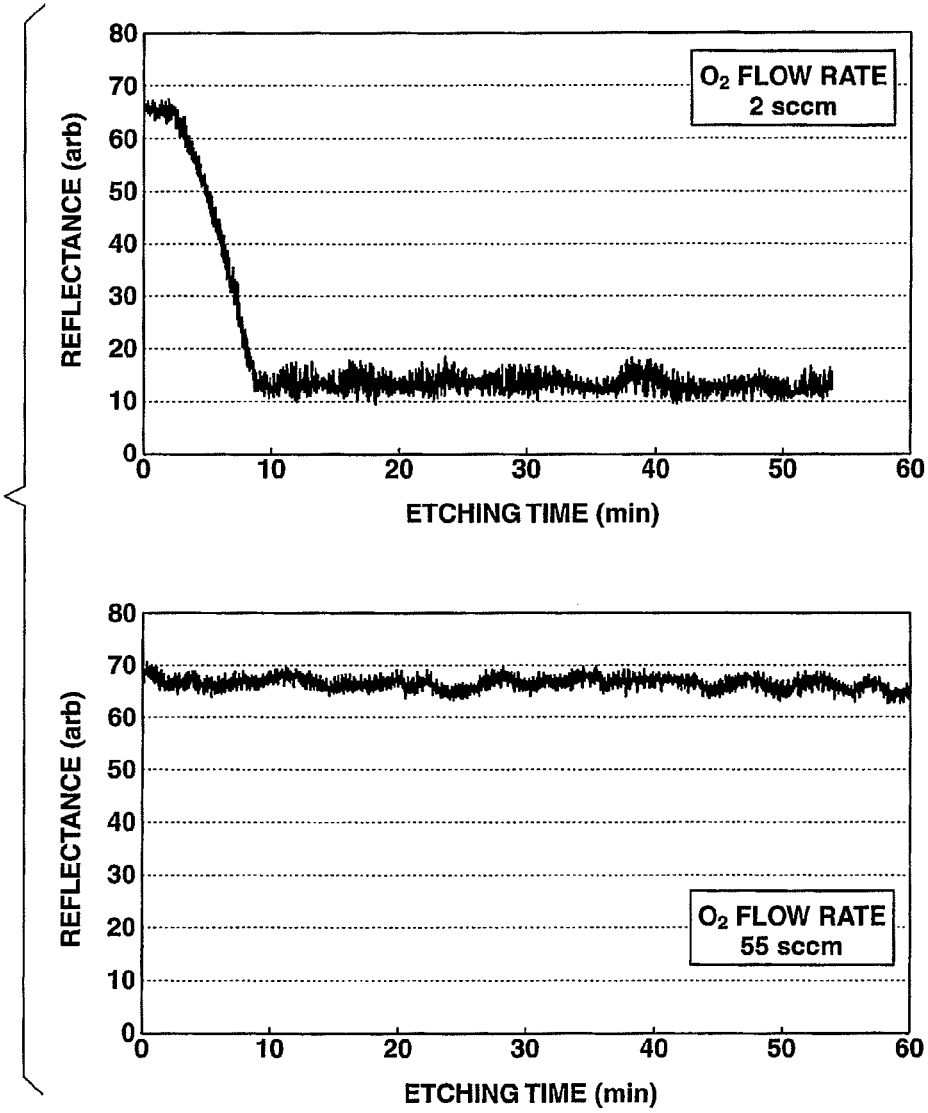
FIG. 2 is a diagram showing film reflectance versus etching time when films are etched at different $O_2$ flow rates in Experiment 2.

It is seen from FIG. 2 that when the oxygen flow rate is 2 sccm (corresponding to an oxygen/chlorine molar ratio of 2/185), the film is etched at a rate of about 5 nm/min. When the oxygen flow rate is 55 sccm (corresponding to an oxygen/chlorine molar ratio of 55/185), etching does not proceed at all.

Experiment 3

The film tested was a chromium base material film of CrN (Cr:N molar ratio=9:1) having a thickness of 44 nm. As in Experiment 1, a change of reflectance with time was measured. The results are plotted in a diagram of FIG. 3.

Figure 3:
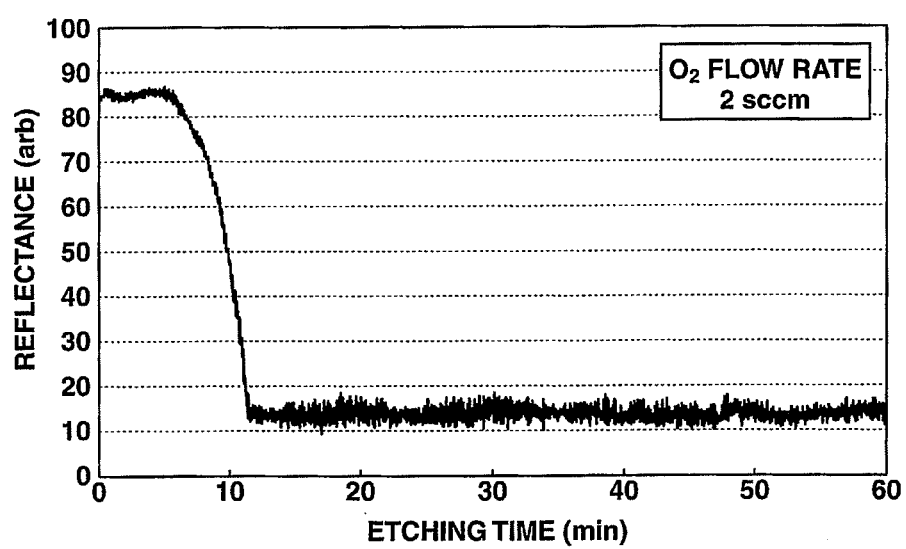
FIG. 3 is a diagram showing film reflectance versus etching time when a film is etched at an $O_2$ flow rate of 2 sccm in Experiment 3.

It is seen from FIG. 3 that when the oxygen flow rate is 2 sccm (corresponding to an oxygen/chlorine molar ratio of 2/185), the film is etched at a rate of about 4 nm/min. This film becomes more etchable as the oxygen content increases.

The above data demonstrate that when chlorine dry etching is carried out at an oxygen flow rate of 2 sccm, only the MoSiN film (Mo:Si:N molar ratio=1:3:1.5 and total oxygen and nitrogen content=27 mol %) which may be used to constitute a light-shielding film can be selectively etched away relative to the MoSiON film (Ma:Si:O:N molar ratio=1:4:1:4 and total oxygen and nitrogen content=50 mol %) which may be used to constitute a phase shift film.

When chlorine dry etching is carried out at an oxygen flow rate of 2 sccm, the CrN film (Cr:N molar ratio=9:1) which may be used as an etching mask film and the MoSiN film can be simultaneously etched away without any damage to the MoSiON film.

When it is desired to remove only the CrN film by dry etching, the oxygen flow rate is increased to 55 sccm. Then the CrN film can be removed without any damage to the MoSiN film.

Example 1

A photomask blank was prepared by depositing a phase shift film of MoSiON (Ma:Si:O:N molar ratio=1:4:1:4) having a thickness of 75 nm and exhibiting a transmittance of 6% and a phase shift of 180° with respect to light of 193 nm wavelength on a quartz substrate and further depositing a light-shielding film of MoSiN (Mo:Si:N molar ratio=1:3:1.5) having a thickness of 31 nm thereon. Using a spin coater, a chemically amplified resist composition adapted for EB lithography was coated on the photomask blank to form a resist film of 1,500 Å thick. The resist film was patternwise exposed in an EB lithography system and developed to form a resist pattern for protecting a region of the phase shift film to be retained.

Etching Step 1-1

Next, using the resist pattern as an etching mask, a region of the phase shift film not to be retained was etched by a fluorine dry etching process under the following conditions for thereby processing the light-shielding film and phase shift film into a predetermined phase shifter pattern shape.

RF1 (RIE): CW 54 V
RF2 (ICP): CW 325 W
Pressure: 5 mTorr
$SF_6$: 18 sccm
$O_2$: 45 sccm
etching time: 2 min Etching Step 1-2

Next the light-shielding film was etched by an oxygen-containing chlorine dry etching process under the following conditions. Only the light-shielding film was selectively removed.

RF1 (RIE): pulse 700 V
RF2 (ICP): CW 400 W
Pressure: 6 mTorr
$Cl_2$: 185 sccm
$O_2$: 2 sccm
He: 9.25 sccm
etching time: 12 min When it is desired to retain a portion of the light-shielding film in etching step 1-2, a resist composition is again coated, exposed and developed to form a resist pattern for protecting a region of the light-shielding film to be retained. Chlorine dry etching is then carried out to selectively remove only the unnecessary portion of light-shielding film. In this way, a light-shielding pattern on the phase shifter or a light-shielding band at the pattern periphery can be formed.

Example 2

A photomask blank was prepared by depositing a phase shift film of MoSiON (Mo:Si:O:N molar ratio=1:4:1:4) having a thickness of 75 nm and exhibiting a transmittance of 6% and a phase shift of 180° with respect to light of 193 nm wavelength on a quartz substrate, then depositing a light-shielding film of MoSiN (Mo:Si:N molar ratio=1:3:1.5) having a thickness of 31 nm thereon, and further depositing a CrN film (Cr:N molar ratio=9:1) having a thickness of 10 nm as an etching mask or hardmask film. Using a spin coater, a chemically amplified resist composition adapted for EB lithography was coated on the photomask blank to form a resist film of 1,500 Å thick. The resist film was patternwise exposed in an EB lithography system and developed to form a resist pattern for protecting a region of the phase shift film to be retained.

Etching Step 2-1

Next, using the resist pattern as an etching mask, portions of the hardmask film and the light-shielding film on a region of the phase shift film not to be retained were etched by a chlorine dry etching process under the following conditions.

RF1 (RIE): pulse 700 V
RF2 (ICP): CW 400 W
Pressure: 6 mTorr
$Cl_2$: 185 sccm
$O_2$: 2 sccm
He: 9.25 sccm
etching time: 5 min Etching Step 2-2

Next, using the hardmask film as an etching mask, fluorine dry etching was carried out under the following conditions for thereby processing the remaining portion of the light-shielding film and the phase shift film into a predetermined phase shifter pattern shape.

RF1 (RIE): CW 54 V
RF2 (ICP): CW 325 W
Pressure: 5 mTorr
$SF_6$: 18 sccm
$O_2$: 45 sccm
etching time: 2 min Etching Step 2-3

Next, a resist composition was again coated, exposed and developed to form a resist pattern for protecting a region of the light-shielding film to be retained. Chlorine dry etching was carried out under the following conditions. Only the hardmask film and the light-shielding film were selectively removed in the single etching step without damage to the phase shift film. In this way, a light-shielding pattern on the phase shifter or a light-shielding band at the pattern periphery can be formed.

RF1 (RIE): pulse 700 V
RF2 (ICP): CW 400 W
Pressure: 6 mTorr
$Cl_2$: 185 sccm
$O_2$: 2 sccm
etching time: 15 min Etching Step 2-4

Next, chlorine dry etching was carried out under the following conditions. Only the hardmask film was selectively removed.

RF1 (RIE): pulse 700 V
RF2 (ICP): CW 400 W
Pressure: 6 mTorr
$Cl_2$: 185 sccm
$O_2$: 55 sccm
He: 9.25 sccm
etching time: 2 min Example 3

A photomask blank was prepared by depositing a phase shift film of MoSiON (Mo:Si:O:N molar ratio=1:4:1:4) having a thickness of 75 nm and exhibiting a transmittance of 6% and a phase shift of 180° with respect to light of 193 nm wavelength on a quartz substrate, then depositing a light-shielding film of MoSiN (Mo:Si:N molar ratio=1:3:1.5) having a thickness of 31 nm thereon, and further depositing a CrN film (Cr:N molar ratio=9:1) having a thickness of 10 nm as an etching mask or hardmask film. Using a spin coater, a chemically amplified resist composition adapted for EB lithography was coated on the photomask blank to form a resist film of 1,500 Å thick. The resist film was patternwise exposed in an EB lithography system and developed to form a resist pattern for protecting a region of the phase shift film to be retained.

Etching Step 3-1

Next, using the resist pattern as an etching mask, a portion of the hardmask film on a region of the phase shift film not to be retained was etched by a chlorine dry etching process under the following conditions.

RF1 (RIE): pulse 700 V
RF2 (ICP): CW 400 W
Pressure: 6 mTorr
$Cl_2$: 185 sccm
$O_2$: 55 sccm
He: 9.25 sccm
etching time: 2 min Etching Step 3-2

Next, using the hardmask film as an etching mask, fluorine dry etching was carried out under the following conditions for thereby processing the light-shielding film and the phase shift film into a predetermined phase shifter pattern shape.

RF1 (RIE): CW 54 V
RF2 (ICP): CW 325 W
Pressure: 5 mTorr
$SF_6$: 18 sccm
$O_2$: 45 sccm
etching time: 2 min Etching Step 3-3

Next, a resist composition was again coated, exposed and developed to form a resist pattern for protecting a region of the light-shielding film to be retained. Chlorine dry etching was carried out under the following conditions. Only the hardmask film and the light-shielding film were selectively removed in the single etching step without damage to the phase shift film.

RF1 (RIE): pulse 700 V
RF2 (ICP): CW 400 W
Pressure: 6 mTorr
$Cl_2$: 185 sccm
$O_2$: 2 sccm
etching time: 15 min Etching Step 3-4

Next, chlorine dry etching was carried out under the following conditions. Only the hardmask film was selectively removed. In this way, a light-shielding pattern on the phase shifter or a light-shielding band at the pattern periphery can be formed.

RF1 (RIE): pulse 700 V
RF2 (ICP): CW 400 W
Pressure: 6 mTorr
$Cl_2$: 185 sccm
$O_2$: 55 sccm
He: 9.25 sccm
etching time: 2 min In any of the foregoing processes, cleaning steps may be performed before and after the etching step, if desired. Also, after the etching step, the remaining resist film may be removed using sulfuric acid/hydrogen peroxide water.

In Examples, an etching mask or hardmask film of chromium base material is formed on the light-shielding film. Where a chromium base material layer functioning as an antireflective coating is formed as a fraction of the light-shielding film, the chromium base material used has a higher content of nitrogen or nitrogen and oxygen than the CrN film (Cr:N=9:1) used as the etching mask film of chromium base material in Examples. When this structure is etched under the same etching conditions, this chromium base material layer provides a higher etching rate than the CrN film. Therefore, the chromium base material layer functioning as an antireflective coating can be etched within a shorter time under the above-described chlorine dry etching conditions. That is, the same processing conditions as above can be applied.

Japanese Patent Application Nos. 2009-006907 and 2009-006929 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A dry etching method comprising the steps of:
providing a laminate comprising a first silicon base material layer of single or multilayer structure containing oxygen and/or nitrogen, and a transition metal and a second silicon base material layer of single or multilayer structure disposed contiguous to the first silicon base material layer and containing a transition metal, wherein both of the transition metals of the first and second silicon base material layers comprise molybdenum, a total content (mol %) of oxygen and nitrogen in the second silicon base material layer being lower than that in the first silicon base material layer,
determining etching rates of the first and second silicon base material layers by forming the first silicon base material layer on a substrate, forming the second silicon base material layer or the silicon base material sublayer of the second silicon base material layer on a substrate, dry etching individually the first and second silicon base material layers on substrates with an oxygen-containing chlorine etchant gas while varying a molar ratio of oxygen to chlorine, and selecting a molar ratio of oxygen to chlorine in the oxygen-containing chlorine etchant gas which permits the second silicon base material layer to be selectively etched from the laminate while retaining the first silicon base material layer by comparing the etching rates, and carrying out the chlorine dry etching at the selected ratio, thereby selectively etching away the second silicon base material layer in the laminate while retaining the first silicon base material layer.

2. The dry etching method of claim 1 wherein said second silicon base material layer comprises a silicon base material sublayer containing nitrogen and/or oxygen, and a transition metal.

3. The dry etching method of claim 2 wherein said second silicon base material layer further comprises another silicon base material sublayer disposed contiguous to the first silicon base material layer, which is free of nitrogen and oxygen and contains a transition metal.

4. The dry etching method of claim 2 wherein provided that the first silicon base material layer has a total content C1 (mol %) of nitrogen and oxygen, and the silicon base material sublayer containing nitrogen and/or oxygen and optionally a transition metal included in the second silicon base material layer has a total content C2 (mol %) of nitrogen and oxygen, the difference between these total contents (C1−C2) is at least 5.

5. The dry etching method of claim 1 wherein the chlorine dry etching uses oxygen-containing chlorine gas in a molar ratio of oxygen to chlorine between 0.0001 and 1.

6. The dry etching method of claim 1 wherein said laminate further comprises a chromium base material layer disposed contiguous to the second silicon base material layer, and both the chromium base material layer and the second silicon base material layer are removed by the chlorine dry etching.

7. The dry etching method of claim 1 wherein the first and second silicon base material layers are formed on a transparent substrate to constitute functional films for a photomask blank.

8. The dry etching method of claim 7 wherein the first silicon base material layer constitutes a fraction or the entirety of a phase shift film of the photomask blank, and the second silicon base material layer constitutes a fraction or the entirety of a light-shielding film of the photomask blank.

9. A dry etching method comprising the steps of:
providing a laminate comprising a first silicon base material layer of single or multilayer structure containing oxygen and/or nitrogen, and a transition metal and a second silicon base material layer of single or multilayer structure disposed contiguous to the first silicon base material layer and containing a transition metal, wherein both of the transition metals of the first and second silicon base material layers comprise molybdenum, a total content (mol %) of oxygen and nitrogen in the second silicon base material layer being lower than that in the first silicon base material layer, determining etching rates of the first and second silicon base material layers by forming the first silicon base material layer on a substrate, forming the second silicon base material layer or the silicon base material sublayer of the second silicon base material layer on a substrate, dry etching individually the first and second silicon base material layers on substrates with an oxygen-containing chlorine etchant gas while varying a molar ratio of oxygen to chlorine, and selecting a molar ratio of oxygen to chlorine in the oxygen-containing chlorine etchant gas which permits the second silicon base material layer to be selectively etched from the laminate while retaining the first silicon base material layer by comparing the etching rates, and carrying out the chlorine dry etching at the selected ratio, thereby selectively etching away the second silicon base material layer in the laminate while retaining the first silicon base material layer, wherein the first and second silicon base material layers are formed on a transparent substrate to constitute functional films for a photomask blank, and the first silicon base material layer constitutes a fraction or the entirety of a phase shift film of the photomask blank, and the second silicon base material layer constitutes a fraction or the entirety of a light-shielding film of the photomask blank.

10. The dry etching method of claim 9, wherein said second silicon base material layer comprises a silicon base material sublayer containing nitrogen and/or oxygen, and a transition metal.

11. The dry etching method of claim 10, wherein said second silicon base material layer further comprises another silicon base material sublayer disposed contiguous to the first silicon base material layer, which is free of nitrogen and oxygen and contains a transition metal.

12. The dry etching method of claim 10, wherein provided that the first silicon base material layer has a total content C1 (mol %) of nitrogen and oxygen, and the silicon base material sublayer containing nitrogen and/or oxygen, and a transition metal included in the second silicon base material layer has a total content C2 (mol %) of nitrogen and oxygen, the difference between these total contents (C1−C2) is at least 5.

13. The dry etching method of claim 9, wherein the chlorine dry etching uses oxygen-containing chlorine gas in a molar ratio of oxygen to chlorine between 0.0001 and 1.

14. The dry etching method of claim 9, wherein said laminate further comprises a chromium base material layer disposed contiguous to the second silicon base material layer, and both the chromium base material layer and the second silicon base material layer are removed by the chlorine dry etching.

15. A dry etching method comprising the steps of:
providing a laminate comprising a first silicon base material layer of single or multilayer structure containing nitrogen or nitrogen and oxygen and a transition metal and a second silicon base material layer of single or multilayer structure disposed contiguous to the first silicon base material layer and containing a transition metal, wherein both of the transition metals of the first and second silicon base material layers comprise molybdenum, a total content (mol %) of oxygen and nitrogen in the second silicon base material layer being lower than that in the first silicon base material layer, determining etching rates of the first and second silicon base material layers by forming the first silicon base material layer on a substrate, forming the second silicon base material layer or the silicon base material sublayer of the second silicon base material layer on a substrate, dry etching individually the first and second silicon base material layers on substrates with an oxygen-containing chlorine etchant gas while varying a molar ratio of oxygen to chlorine, and selecting a molar ratio of oxygen to chlorine in the oxygen-containing chlorine etchant gas which permits the second silicon base material layer to be selectively etched from the laminate while retaining the first silicon base material layer by comparing the etching rates, and carrying out the chlorine dry etching at the selected ratio, thereby selectively etching away the second silicon base material layer in the laminate while retaining the first silicon base material layer.

16. The dry etching method of claim 15, wherein said second silicon base material layer comprises a silicon base material sublayer containing nitrogen and/or oxygen, and a transition metal.

17. The dry etching method of claim 16, wherein said second silicon base material layer further comprises another silicon base material sublayer disposed contiguous to the first silicon base material layer, which is free of nitrogen and oxygen and contains a transition metal.

18. The dry etching method of claim 16, wherein provided that the first silicon base material layer has a total content C1 (mol %) of nitrogen and oxygen, and the silicon base material sublayer containing nitrogen and/or oxygen, and a transition metal included in the second silicon base material layer has a total content C2 (mol %) of nitrogen and oxygen, the difference between these total contents (C1−C2) is at least 5.

19. The dry etching method of claim 15, wherein the chlorine dry etching uses oxygen-containing chlorine gas in a molar ratio of oxygen to chlorine between 0.0001 and 1.

20. The dry etching method of claim 15, wherein said laminate further comprises a chromium base material layer disposed contiguous to the second silicon base material layer, and both the chromium base material layer and the second silicon base material layer are removed by the chlorine dry etching.

21. The dry etching method of claim 15, wherein the first and second silicon base material layers are formed on a transparent substrate to constitute functional films for a photomask blank.

* * * * *